US007782071B2

(12) United States Patent
Endres

(10) Patent No.: US 7,782,071 B2
(45) Date of Patent: Aug. 24, 2010

(54) PROBE CARD ANALYSIS SYSTEM AND METHOD

(75) Inventor: Eric Endres, Issaquah, WA (US)

(73) Assignee: Rudolph Technologies, Inc., Flanders, NJ (US)

( * ) Notice: Subject to any disclaimer, the term of this patent is extended or adjusted under 35 U.S.C. 154(b) by 0 days.

(21) Appl. No.: 11/960,597

(22) Filed: Dec. 19, 2007

(65) Prior Publication Data

US 2008/0197865 A1 Aug. 21, 2008

Related U.S. Application Data

(60) Provisional application No. 60/870,832, filed on Dec. 19, 2006, provisional application No. 60/871,449, filed on Dec. 21, 2006.

(51) Int. Cl.
*G01R 31/02* (2006.01)

(52) U.S. Cl. .............. 324/758; 324/754; 324/158.1

(58) Field of Classification Search .......... 324/754–762
See application file for complete search history.

(56) References Cited

U.S. PATENT DOCUMENTS 4,918,374 A * 4/1990 Stewart et al. ............... 324/758
5,422,579 A * 6/1995 Yamaguchi ................. 324/758
5,508,629 A * 4/1996 Stewart et al. ............ 324/158.1
5,510,723 A * 4/1996 Canella et al. .............. 324/758
5,561,377 A * 10/1996 Strid et al. .................. 324/754
6,127,831 A 10/2000 Khoury et al.
6,420,891 B1 7/2002 Liu
6,686,753 B1 * 2/2004 Kitahata ..................... 324/754
6,809,536 B2 * 10/2004 Suzuki ....................... 324/754
6,911,814 B2 * 6/2005 Miller et al. ............. 324/158.1
7,016,260 B2 * 3/2006 Bary ........................... 367/15
7,170,307 B2 * 1/2007 Strom ........................ 324/758

FOREIGN PATENT DOCUMENTS

| JP | 2005-079253 | 3/2005 |
| JP | 2006-023229 | 1/2006 |
| WO | 01/08819 A1 | 2/2001 |
| WO | 2005/005996 A2 | 1/2005 |

* cited by examiner

*Primary Examiner*—Ha Tran T Nguyen
*Assistant Examiner*—Richard Isla Rodas
(74) *Attorney, Agent, or Firm*—Dicke, Billig & Czaja, PLLC

(57) ABSTRACT

A system and method for evaluating wafer test probe cards under real-world wafer test cell condition integrates wafer test cell components into the probe card inspection and analysis process. Disclosed embodiments may utilize existing and/or modified wafer test cell components such as, a head plate, a test head, a signal delivery system, and a manipulator to emulate wafer test cell dynamics during the probe card inspection and analysis process.

5 Claims, 5 Drawing Sheets

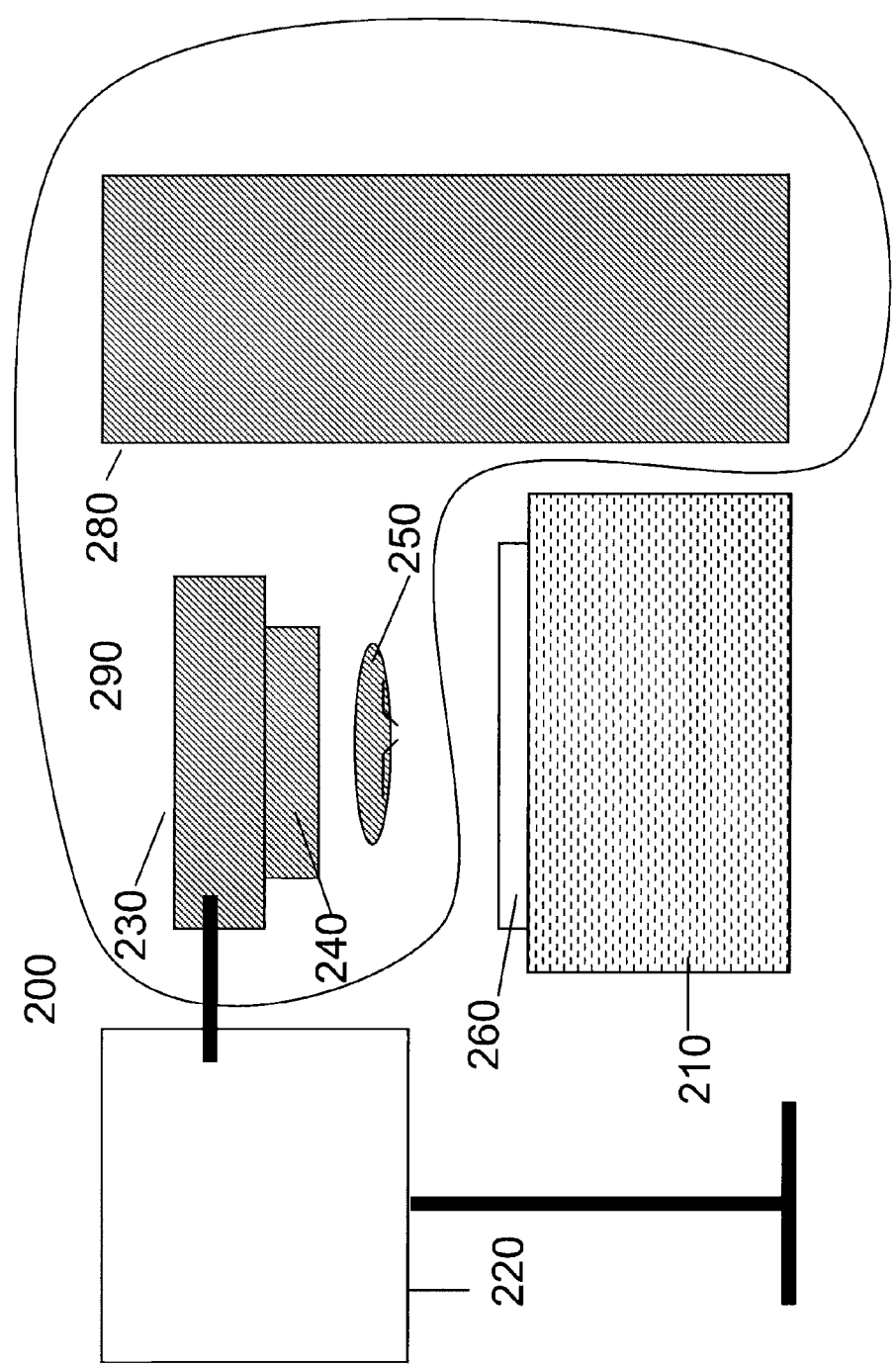

though other wafer test cell components and configurations may be employed for testing wafers. Generally, wafer test cells may be viewed as incorporating (1) a prober, (2) probe array, and (3) tester electronics.

PROBE CARD ANALYSIS SYSTEM AND METHOD

This application claims the benefit of provisional application Ser. No. 60/870,832 entitled "PROBE CARD ANALYSIS SYSTEM AND METHOD," filed Dec. 19, 2006, and provisional application Ser. No. 60/871,449 entitled "PROBE CARD ANALYSIS SYSTEM AND METHOD," filed Dec. 21, 2006, both of which are hereby incorporated herein by reference in their entirety and for all purposes.

FIELD OF INVENTION

This invention relates to the field of semiconductor test methods and equipment. More particularly, this invention relates to methods and equipment for the inspection and analysis of probe cards used in the testing of semiconductor integrated circuit components.

BACKGROUND OF THE INVENTION

In the semiconductor industry, many replicate components, or die, are created on a single silicon wafer. In order to eliminate faulty die prior to the cost intensive step of packaging, semiconductor fabricators typically perform wafer testing or sorting. The performance characteristics of the die are evaluated in a wafer test cell or test station by establishing electrical connectivity between the bonding pads or bumps present on each individual die and external test equipment.

A variety of wafer test cells components and configurations are possible and FIG. 1 illustrates one wafer test cell configuration. Test cell 10 may incorporate: a probe card or probe array 50 comprising an array of fine wires, formed springs or similar conductive elements known as probe pins; a test head or interface unit 30 upon which a probe array may be structurally coupled or mounted; a signal delivery system 40 which establishes electrical contact between probe array 50 and tester 80; manipulator 20 which functions to support and move test head 30, signal delivery system 40, and probe array 50; a test machine or tester 80 which is electrically coupled to probe array 50 and able to generate, detect and measure electrical signals in a manner suitable to determine the performance of the individual die on the wafer or device under test (DUT); a prober 70 which aligns the wafer to probe array 50 such that the probe pins make accurate contact with the wafer bonding pads; and a head plate 60 which facilitates docking or mating between prober 70 and the other test cell components.

In practice, wafer test cell 10 may utilize one tester controlling one or more probers with each prober contacting one or multiple DUTs of one wafer at a time. A wafer is loaded and positioned horizontally with bonding pads facing up in prober 70. Probe array 50 is loaded or secured to test head 30 such that it can be positioned horizontally with probe pins facing down. Manipulator 20 may be used to position test head 30, signal delivery system 40, and probe array 50 to head plate 60 of prober 70. A prober provides alignment functionality by developing a positional relationship between the probe array and the bonding pads of the DUT. For example, a prober may incorporate two cameras, one operable to image the probe array and one operable to image the bonding pads of the DUT. Based on the image data collected, prober will align the probe array to the corresponding bonding pads. Once a first wafer has been aligned, probers usually have a step and repeat subsystem, which permits this process to be repeated for each DUT or group of DUTs. Exemplary prober systems and functionalities are described in U.S. Pat. Nos. 6,096,567 and 6,111,421, hereby incorporated by reference in their entirety.

In other wafer test cell configurations, the various wafer test cell components described above may be integrated into one another. FIG. 1 shows some of the components, or component functionalities, that may be integrated with one another as shaded. For example, some or all of the tester, test head, signal delivery system, and probe array functionality may be integrated into a single head complex 90. In practice, head complex 90 may be coupled to head plate 80 which may in turn be mounted on to prober 70. The V5400 system, designed and manufactured by Verigy Ltd., is an example of one such an integrated wafer test cell system although other wafer test cell components and configurations may be employed for testing wafers. Generally, wafer test cells may be viewed as incorporating (1) a prober, (2) probe array, and (3) tester electronics.

Also relevant is the inspection and testing of the equipment employed in the wafer test cell. Of particular interest is the inspection and analysis of probe array 50. Wafer test probe card inspection and analysis has conventionally been performed by one of several varieties of stand-alone wafer test probe card analysis systems. Examples of probe card inspection and analysis systems are embodied in the probeWoRx® 300/200 and PrecisionPoint VX probe card analysis systems, designed and manufactured by Applied Precision LLC, of Issaquah Wash.

FIG. 2 is a block illustration of an exemplary wafer test probe card inspection and analysis system. The generalized probe card inspection and analysis system 100 comprises a probe array analyzer module 110; a motherboard 120; and the probe array 50 to be tested. Motherboard 120 is a specialized system component that adopts or docks a specific purpose probe array 50 to the general-purpose probe array analyzer module 110. Motherboard 120 provides electrical contact between probe array 50 and the measurement electronics of probe card inspection and analysis system 100. The design of the motherboard is constrained by (1) the electrical and mechanical characteristics of conventional stand alone probe card inspection and analysis system and (2) the mechanical and electrical characteristics of the specific probe card being tested. In practice, motherboard 120 functions similarly to the signal delivery system 40 and/or test head 30 of wafer test cell 10, described above and illustrated in FIG. 1.

Probe array analyzer module 110 comprises a transposable stage or fiducial plate such as a planar conductive surface which may or may not be transparent or bare fiducial marks; a mechanical positioning components such as precision actuators; imaging components such as optical lenses and an illumination sources; imaging sensors such as a CCD or CMOS, electrical probe array test components, and a computer. The probe array analysis module 110 computer may operate through hardware and software components, such as drivers, frame grabbers, and image acquisition, analysis, and pattern matching software well known in the field. Generally speaking, the computer controls the overall operation of probe card inspection and analysis system 100. The computer may be viewed as functioning, in part, analogously to tester 80 of wafer test cell 10, described above and illustrated in FIG. 1.

Conventional probe card inspection and analysis systems determine probe needle locations in three-dimensional space and analyze the movement of needles under a programmable range of loaded and unloaded conditions. Several techniques known in the art such as, traditional lead screw or optical comparative metrology may be employed to determine probe pin locations. For example, probe pin locations may be determined by scanning the pins across a conductive and/or non-conductive transition on a stage as disclosed in U.S. Pat. Nos. 4,918,374, 5,508,629, and 5,831,443, which are hereby incorporated by reference in their entirety. Probe pin locations may also be determined by a combination of a precision motion stage and a video camera as described in U.S. Pat. No. 5,657,394, which is hereby incorporated by reference in its entirety. Alternatively, probe pin positions may be determined by utilizing a fiduciary plate having a plurality of fiduciary marks and a digital imaging device, as disclosed and claimed in U.S. Pat. No. 6,710,798, which is hereby incorporated by reference in its entirety.

Probe card inspection and analysis systems may also be operable to evaluate other probe card characteristics including, for example, probe card planarity, probe array planarity, probe card alignment, probe card pin alignment, electrical planarity, optical planarity, no-load planarity, loaded planarity, probe card/fixture deflection, leakage, wirechecker, probe force, and contact resistance. Probe card inspection and analysis systems may also be equipped with electrical signal generation and detection capabilities suitable to determine the functionality or characterize the performance of certain electronic components that may be incorporated into probe card circuit designs. Such components include voltage sources, voltage meters, current sources, current meters, multiplex electronics, relays, electronic buffers, MUX switches, electronic memory devices, communication circuitry and the like. Some probe card inspection and analysis systems may also incorporate probe card rework functionality.

Over the last decade, there has been a trend to increase the parallelism of wafer testing, particularly, for dynamic and flash memory testing. This allows devices with long test times to be processed more efficiently and thereby reduce cost. The current trend is to design and manufacture wafer test cell components such that a wafer is tested in a minimum number of touches, i.e. a probe array is brought into contact with a single wafer one time in order to facilitate testing of each DUT on the wafer.

As parallelism in wafer testing increases so does the complexity, size and weight of the previously described wafer test head components. For example, as parallelism increases so does the number of probe pins in the probe array. The increased number of pins necessitates the application of higher forces in order to contact the pins to the pads or bumps of the DUT. The use of higher forces in turn requires the implementation of more structurally rigid components, components with increased sizes and/or weights. These components generate interactions between the test head, probe card, and prober unique to a specific test cell. The conventional probe card inspection and analysis system is structurally limited in its ability to mimic or otherwise simulate these unique characteristics of a wafer test cell. As a result, the results obtained from a conventional probe card inspection and analysis system may be of increasingly limited value when used to troubleshoot problems in the increasingly complex probing process. What is needed in the field is an apparatus and method for the inspection and analysis of probe arrays under conditions that more closely correlate with the real-world conditions of the wafer test cell.

SUMMARY

The present invention provides an apparatus and method for the inspection and analysis of probe cards under wafer test cell conditions. Certain embodiments of the invention employ wafer test cell components that are either identical to or substantially similar to the physical attributes of the same components utilized in a real-world wafer test cell. These components are integrated into a system operable to perform wafer test probe card inspection and analysis. By integrating certain wafer test cell components into the probe card inspection and analysis process, evaluation of probe card performance characterizes may more accurately reflect real-world test cell conditions.

BRIEF DESCRIPTION OF THE DRAWINGS

FIG. 3 is a functional block diagrams illustrating an example of a probe array inspection and analysis system incorporating various components and/or characteristics of a conventional wafer test cell.

DESCRIPTION OF THE INVENTION

Embodiments of the present invention will now be described in detail with reference to the drawings, which are provided as illustrative examples so as to enable those skilled in the art to practice the invention. Notably, the figures and examples below are not meant to limit the scope of the present invention to a single embodiment, but other embodiments are possible by way of interchange of some or all of the described or illustrated elements. Where certain elements of these embodiments can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, it is not intended that any term in the specification or claims be ascribed an uncommon or special meaning unless explicitly set forth as such. Further, the present invention encompasses present and future known equivalents to the components referred to herein by way of illustration.

The present invention provides systems and methods for the inspection and analysis of probe arrays used in semiconductor test equipment (hereinafter referred to as a semiconductor test cell or wafer test cell). In certain embodiments, the systems and methods are concerned with the inspection and analysis of probe arrays under real-world wafer test cell conditions. In contrast to conventional probe card analysis systems and their reliance on a motherboard for interacting with the probe array, the present invention can directly interface conventional probe card inspection and analysis functionality with wafer test cell system components. Systems and methods according to certain aspects of the invention employ probe array inspection functionality in a structure analogous or identical to the structure of a wafer test cell prober. Probe array analysis functionality may also be employed in a structure analogous or identical to that of a prober and may further be employed in other wafer test cell or test cell-like components. Direct utilization of wafer test cell components that, in combination, affect a probe array performance during the probing process—for example, signal delivery system, test head or interface unit, and/or head complex—may yield improved probe array analyses over that of a conventional probe card inspection and analysis system. These improved analyses can more accurately reflect the complex conditions of a real-world wafer test cell.

Figure 1:
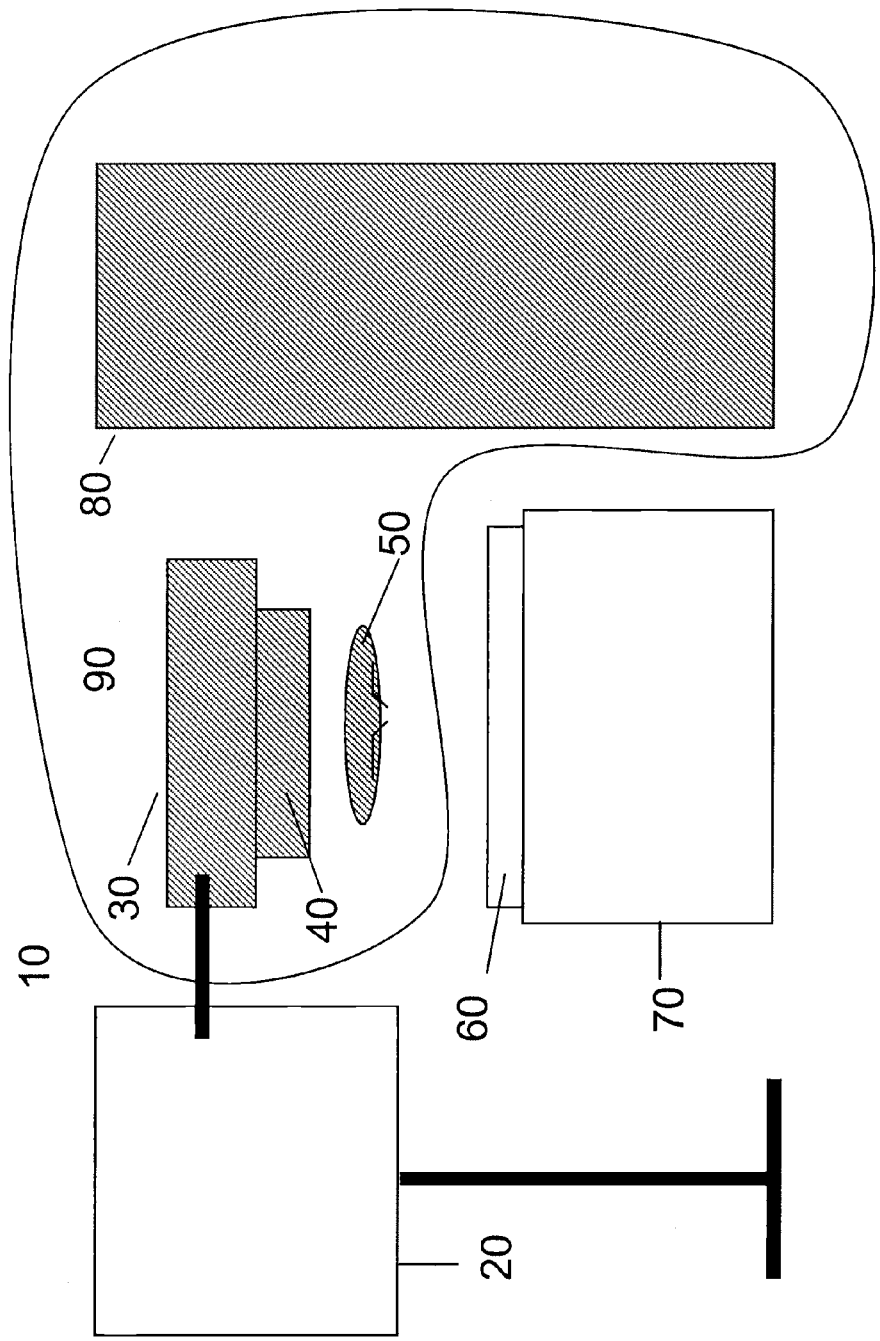
FIG. 1 is a functional block diagrams illustrating a conventional wafer test cell.
Figure 2:
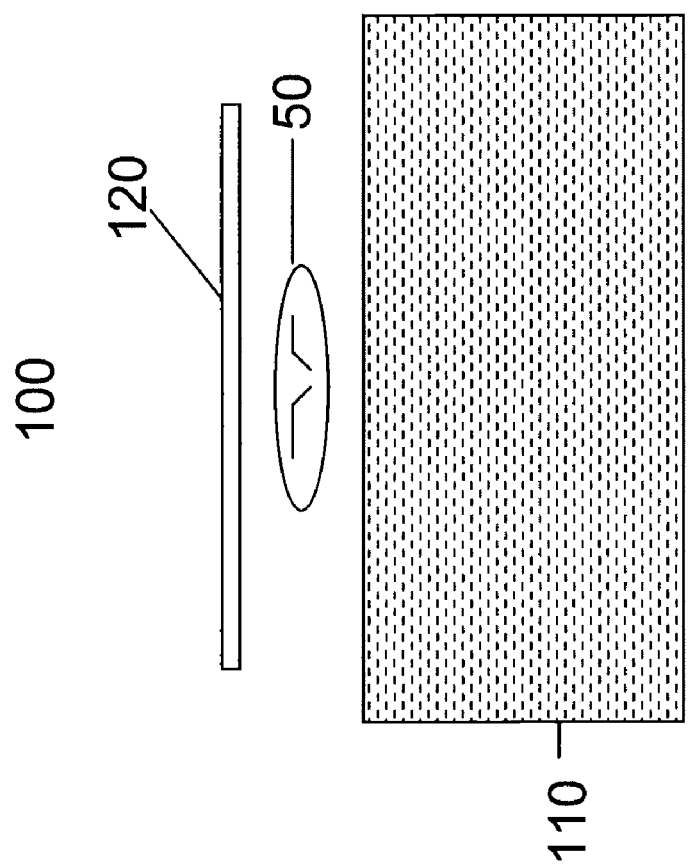
FIG. 2 is a functional block diagrams illustrating a conventional probe card inspection and analysis system.

Certain embodiments of the present invention use at least some features of the relevant wafer test cell components for the purpose of probe array inspection and analysis as required or desired. In particular, in certain embodiments, only the structural aspects or physical characteristics of the relevant wafer test cell components are maintained in the inspection and analysis equipment. For example, and with reference to FIG. 1, the present invention may employ only the outer structure, docking hardware, and/or weight and balance characteristics of the wafer test cell component or components employing the functionality of signal delivery system 40, test head 30, tester 80 and/or head complex 90 utilized in the relevant wafer test cell. Certain functionality of the relevant wafer test components may be deleted or replaced with probe array inspection and analysis specific mechanical, electrical, and software components. For example, probe array inspection and analysis electronics, such as application specific printed circuit board, may be designed to match the footprint and connectivity of the wafer test cell component's wafer test electrics. Adaptation of relevant wafer test cell components for use in probe array inspection and analysis systems employing certain embodiments of the present invention may therefore be streamlined by a simple replacement of wafer test cell component electronics.

With reference to FIG. 3, in certain embodiments, a wafer test probe array analysis system 200 may comprise combinations of head plate 260, signal delivery system 240, test head or interface unit 230, manipulator 220, tester 280, head complex 290 and probe array analyzer module 210. Manipulator 220 may be utilized to support, transpose, and dock test head unit 230, signal delivery system 240, and probe array 250, or head complex 290. In addition, manipulator 220 is typically configured to perform conventional wafer test functionalities with various makes and models of test heads or interface units. Similarly, test head 240 may be operable to dock or otherwise mount various makes, models and types of signal delivery systems and probe arrays including, but not limited to, vertical, Cobra, cantilever, membrane, and microspring probe arrays. When probe array 250, signal delivery system 240, test head 230 have been operably joined, manipulator 220 may transpose and dock the components with head plate 260. Manipulator 220 may also be configured to transpose and dock head complex 290 with head plate 260. Head plate 260 may be mounted, attached, or otherwise coupled to probe array analyzer module 210. After the components are aligned and docked with head plate 260, the relevant wafer test cell or test cell-like components can be assembled on to probe array analysis module 210 and probe array inspection and analysis may ensue.

In certain embodiments, selected wafer test cell components can be modified or otherwise enhanced to facilitate performance of probe array inspection and analysis functions in addition to conventional wafer test cell functionality. For example, the functionality of a conventional manipulator 20, test head 30, signal interface 40, prober 70 and/or tester 80 of FIG. 1 can be modified or enhanced in accordance with aspects of the invention such that these modified components can perform the desired probe array inspection and analysis functions. The probe array inspection and analysis process may be conducted, in whole or in part, by actual wafer test cell components.

Figure 4A:
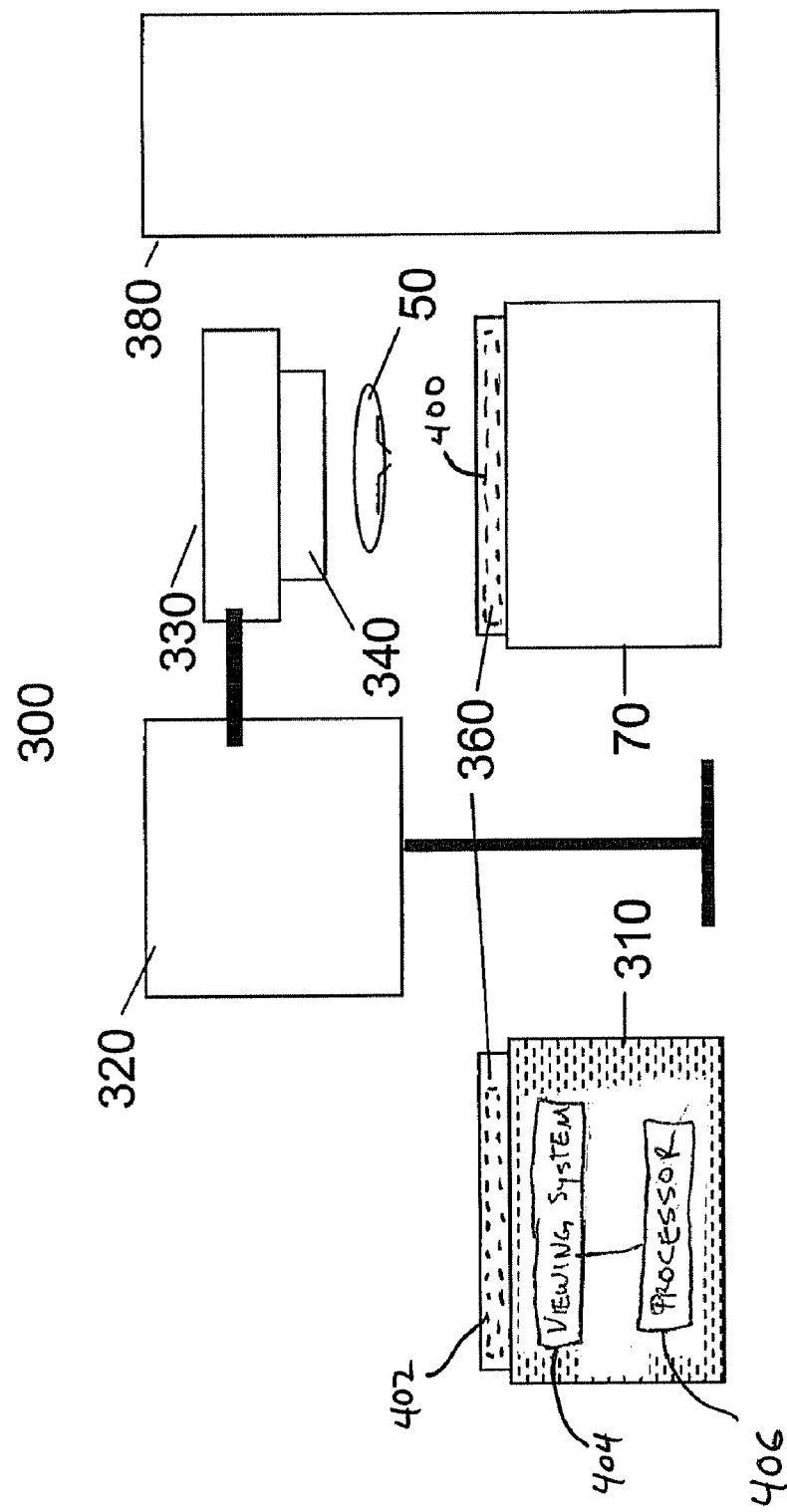
FIGS. 4A & B are functional block diagrams illustrating a system configuration in which a wafer test process and a probe array inspection and analysis process share specific wafer test cell components.
Figure 4B:
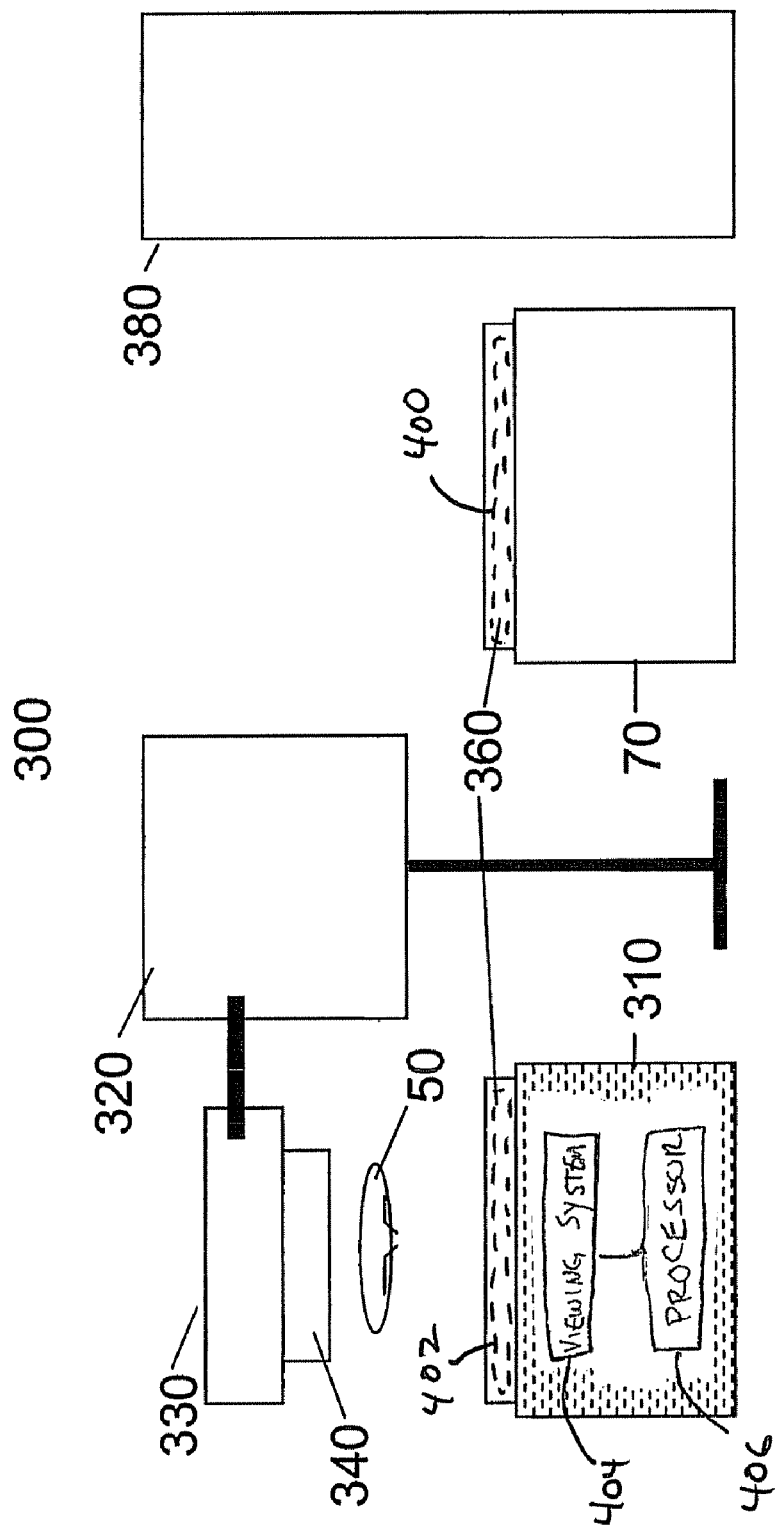

As illustrated in FIGS. 4A and 4B, probe array analyzer module 310 may be situated proximate to the wafer test cell. Manipulator 320 can be used to transpose and support test head 330, signal delivery system 340, and probe array 50 for docking to head plate 360 situated on probe array analyzer module 310. In certain embodiments, the probe array inspection and analysis process may be controlled or conducted solely by probe array analyzer module 310, by tester 380, or by a combination of the two components. Prober 70 and head complex, such as that described above as head complex 90, may employed in this embodiment substantially as described above. In certain embodiments, the system configuration avoids the necessity of creating a duplicate wafer test cell components for use in the probe array inspection and analysis process.

In certain embodiments of the present invention, the entire probe array inspection and analysis process can be provided as improvements or additions to the components of an existing wafer test cell. For example, prober 70, described above and illustrated in FIG. 1, may be enhanced to incorporate probe array inspection and or analysis hardware such as those disclosed in the above referenced patents and applications relating to conventional probe card inspection and analysis systems and methods. More particularly, Prober 70 may employ lead screw or optical comparative metrology techniques to inspect probe arrays. In another example, tester 80 (see FIG. 1) may be modified to perform the analysis functionality previously performed by the computer of the probe card inspection and analysis system.

In one particular embodiment illustrated in FIGS. 4A and 4B, head plate 360 coupled to prober 70 includes a stage 400 for supporting probe array 50. Furthermore, head plate 360 coupled to probe array analyzer module 310 includes a transparent fiducial plate 402. Probe array analyzer module 310 includes a viewing system 404 and processor 406 coupled to viewing system 404 to image probe array 50 and fiducial plate 402. Processor 406 can be configured to process images from viewing system 404 to identify positions of probes on the probe array 50.

Certain embodiments of the present invention enable use of standard wafer test cell probe card handling and loading capabilities. Probe card handling and loading components are commonly recognized and understood in the field.

Certain other embodiments of the present invention provide a signal connection pathway, for example a high frequency signal connection path, between some or all of the following components: probe array, signal delivery system, test head, tester, probe array analyzer module and prober.

It will be appreciated that probe array inspection and analysis system according to certain aspects of the present invention will comprise tester, test head, and/or test complex specific probe array inspection and analysis systems. For example, a probe array inspection and analysis system may be augmented such that the system can inspect and analyze only those probe arrays specifically designed to function with the wafer test cell components. Augmentation may include utilizing, integrating, or otherwise incorporating specific application wafer test cell components into a probe array inspection and analysis system.

The probe array analysis functionality of certain embodiments of the present invention may include all of the probe card analysis functionality previously described including but not limited to: the functionality of the probeWorx and PrecisionPoint probe card analysis systems, and analysis of probe card planarity, probe array planarity, probe card alignment, probe card pin alignment, electrical planarity, optical planarity, no-load planarity, loaded planarity, probe card/fixture deflection, leakage, wirechecker, probe force, contact resistance, resistor, capacitance, capacitor. Probe card analysis systems may also incorporate probe card rework operability.

Certain embodiments of the invention exhibit a high degree of accuracy in measurement. Furthermore, certain embodiments offer additional applications of the inspection data obtained. For example, in aligning a probe array to a wafer, a conventional prober may determine the planarity of the probe array with respect to the wafer, as well as the XY position of select probe pins and bonding pads. It will be appreciated that conventional prober performs these analyses merely to the degree necessary to align the probe pins to the bonding pads of the DUT.

In contrast, probe card inspection and analysis systems augmented according to certain aspects of the invention and other embodiments of the present invention can perform probe array and probe pin inspection at a significantly higher degree of accuracy and speed over conventional systems. A further advantage obtained from certain embodiments of the invention is the broader range of testing and measurement capacity available to a user or operator. Furthermore, a broader range of applications can be provided for data obtained including determination of performance characteristics of a probe array in addition to information related to the alignment of the probe array to a wafer.

Additionally, as a result of the wafer probing process, wafer probe marks, or scrub marks, may be made upon the surface of a probed wafer or test wafer as described in U.S. patent application Ser. No. 11/479,822, which is hereby incorporated herein by reference. Inspection and analysis of wafer probe marks may yield valuable data relating to performance and characteristics of a probe card, as well as performance and characteristics of an entire semiconductor test process. Certain embodiment of the present invention may also be used to scrub a wafer or test wafer and to inspect and analyze wafer probe marks. For example, probe array analyzer module 210 or 310, or a modified prober 50 may be configured to load a wafer or test wafer onto a transposable stage substantially identical to the stage present in a wafer probe mark analyzer or wafer prober. The wafer may then be scrubbed and the resulting scrub marks inspected and analyzed. Inspection and analysis may include the position, orientation, and size of certain probe marks, as well as certain probe mark to bonding pad and bonding pad to bonding pad characteristics.

Additional Descriptions of Certain Aspects of the Invention

Certain embodiments of the invention provide systems comprising a probe array and a probe array analyzer module operably coupled to one or more components derived from a semiconductor test cell, whereby the probe array analyzer is for analyzing the probe array under normal operational conditions of the semiconductor test cell. In some of these embodiments, the one or more components include at least one of a head plate, a test head and a head complex. In some of these embodiments, the one or more components include a signal delivery system. In some of these embodiments, the head plate is proportioned in accordance with a wafer test cell head plate employed in the semiconductor test cell. In some of these embodiments, the test head is substantially similar in physical characteristics to a wafer test cell test head employed in the semiconductor test cell. In some of these embodiments, the test head includes probe array inspection and analysis electrical components in place of selected semiconductor test cell electrical components. In some of these embodiments, the signal delivery system is constructed in accordance with the structure of a wafer test cell signal delivery system employed in the semiconductor test cell. In some of these embodiments, the head complex is constructed in accordance with the structure of a wafer test cell head complex employed in the semiconductor test cell. In some of these embodiments, the test complex includes probe array inspection and analysis electrical components in place of selected semiconductor test cell electrical components. Some of these embodiments further comprise a manipulator. In some of these embodiments, the system is operable to analyze the performance characteristics of the probe array under physical conditions substantially similar to the semiconductor test cell. In some of these embodiments, the probe array analyzer module further comprises a wafer test cell prober. Some of these embodiments further comprise a wafer probing process analyzer. In some of these embodiments, the wafer probing process analyzer is operable to inspect and analyze wafer probe marks.

Certain embodiments of the invention provide methods for inspecting and analyzing wafer test probe arrays where the methods comprise mounting a probe array to one or more components derived from a semiconductor test cell, the one or more components including at least one of a head plate, a test head and a head complex, inspecting the probe array, and determining performance characteristics of the probe array based on the inspecting, wherein the one or more derived components facilitate the inspecting under normal operational conditions of the probe array. In some of these embodiments, the head plate is proportioned in accordance with a wafer test cell head plate employed in the semiconductor test cell. In some of these embodiments, the test head is substantially similar in physical characteristics to a wafer test cell test head employed in the semiconductor test cell. In some of these embodiments, the test head includes probe array inspection and analysis electrical components in place of selected semiconductor test cell electrical components. In some of these embodiments, the one or more components include a signal delivery system constructed in accordance with the structure of a wafer test cell signal delivery system employed in the semiconductor test cell. In some of these embodiments, the head complex is constructed in accordance with the structure of a wafer test cell head complex employed in the semiconductor test cell. In some of these embodiments, the test complex includes probe array inspection and analysis electrical components in place of selected semiconductor test cell electrical components. In some of these embodiments, the inspecting is performed using a prober. In some of these embodiments, the head plate is coupled to a probe array analyzer module. Some of these embodiments further comprise the step of generating wafer probe marks. Some of these embodiments further comprise the step of analyzing wafer probe marks. Some of these embodiments further comprise the step of performing a wafer test.

Certain embodiments of the invention provide a wafer test probe array inspection and analysis system comprising a probe array analyzer operably coupled to coupled to one or more components derived from a semiconductor test cell, wherein the probe array analyzer is for analyzing a probe array under normal operational conditions of the semiconductor test cell and wherein the one or more components includes a head plate, a test head and a head complex. Some of these embodiments further comprise a manipulator. In some of these embodiments, the probe array analyzer is operable to perform wafer test cell probing. In some of these embodiments, the system is operable to analyze certain performance characteristics of a wafer test probe array under conditions substantially similar to the operating physical conditions of the semiconductor test cell. Some of these embodiments further comprise a wafer probing process analyzer. In some of these embodiments, the wafer probing process analyzer is operable to inspect and analyze wafer probe marks. In some of these embodiments, the one or more components cooperate to perform wafer tests.

Certain embodiments of the invention provide a method for emulating the characteristics of a wafer test cell while inspecting and analyzing a probe array employed in the test cell, method comprising docking a probe array analyzer module with a wafer test cell, inspecting the probe array and evaluating performance characteristics of the probe card based on the inspecting. In some of these embodiments, the wafer test cell comprises one or more components derived from a semiconductor test cell, the one or more components including a head plate, a test head, a signal delivery system and a head complex. In some of these embodiments, the structures of the one or more components correlate to structures of corresponding components in a wafer test cell. In some of these embodiments, the probe array analyzer module is interfaced with a prober. Some of these embodiments further comprise the step of performing a wafer test. Some of these embodiments further comprise the step of analyzing a wafer probing process. Some of these embodiments further comprise the step of generating scrub marks on a wafer.

Aspects of the present invention have been illustrated and described in detail with reference to particular embodiments by way of example only, and not by way of limitation. It will be appreciated that various modifications and alteration may be made to the exemplary embodiments without departing from the scope and contemplation of the present disclosure.

What is claimed is:

1. A wafer test station comprising:
   a test head having a probe card mounted therein, the probe card having a plurality of probes for forming an electrical connection with at least one device under test when the probes are placed in physical contact with the at least one device under test;
   a prober module having a stage for supporting the at least one device under test and for moving the at least one device under test into and out of contact with the probes of the probe card;
   a probe array analyzer module having an optical inspection system adapted to image each of the plurality of probes of the probe card, the optical inspection system comprising:
   a transparent fiducial plate, the fiducial plate have a plurality of fiducials formed therein in known positions;
   a viewing system positioned to capture an image of at least one of the plurality of probes through the fiducial plate;
   a processor for identifying a position of substantially all of the probes of the probe card relative to the fiducials and to one another;
   wherein the test head, the prober module and the probe array analyzer module include mechanisms associated therewith that permit the test head to be is configured to be selectively coupled to either of the prober module and the probe array analyzer module such that the probe card is loaded in substantially the same manner when the test head is coupled to the prober module or the probe array analyzer module.

2. The wafer test station of claim 1 wherein the probe array analyzer module further comprises:
   an electrical test mechanism for creating a closed test circuit between at least one of the plurality of probes and a probe card tester.

3. The wafer test station of claim 2 wherein the electrical test mechanism is configured to determine at least one of the following concerning at least one probe of a probe card:
   an electrical connectivity of the at least one probe;
   leakage of the at least one probe;
   capacitance of the at least one probe; and
   contact resistance of the at least one probe.

4. The wafer test station of claim 2 wherein the electrical test mechanism comprises a conductive coating on the fiducial plate such that the closed test circuit between the at least one of the plurality of probes and the probe testing system is formed when the at least one probe is in contact with the fiducial plate.

5. The wafer test station of claim 1 wherein the optical inspection system is configured to determine at least one of the following concerning at least one probe of the probe card:
   an XYZ position of the at least one probe when the at least one probe is in a unloaded state;
   an XYZ position of the at least one probe when the at least one probe is in a loaded state; and
   presence of the at least one probe.

* * * * *

UNITED STATES PATENT AND TRADEMARK OFFICE
CERTIFICATE OF CORRECTION

| | |
|---|---|
| PATENT NO. | : 7,782,071 B2 |
| APPLICATION NO. | : 11/960597 |
| DATED | : August 24, 2010 |
| INVENTOR(S) | : Eric Endres |

It is certified that error appears in the above-identified patent and that said Letters Patent is hereby corrected as shown below:

Title Page, Column 2 (Abstract), line 2, delete "condition" and insert in place thereof --conditions--.

Title Page, Column 2 (Abstract), line 2, after "integrates" insert --certain--.

Column 1, line 3 in the Issued Patent, below Title, insert --CROSS-REFERENCE TO RELATED APPLICATIONS--.

Column 6, line 24, delete "and or" and insert in place thereof --and/or--.

Column 9, line 12, after "cell," insert --the--.

Column 10, line 12-13, in Claim 1, after "be" delete "is configured to be".

Signed and Sealed this

Thirtieth Day of November, 2010

David J. Kappos
*Director of the United States Patent and Trademark Office*